(12) United States Patent
Chen et al.

(10) Patent No.: US 11,874,713 B2
(45) Date of Patent: Jan. 16, 2024

(54) ELECTRONIC DEVICE

(71) Applicants: Wei-Ting Chen, Taipei (TW);
Tzu-Chien Lai, Taipei (TW); I-Hsuan Tsai, Taipei (TW); Chien Chiu, Taipei (TW); I-Lung Chen, Taipei (TW);
Tsai-Sheng Yang, Taipei (TW)

(72) Inventors: Wei-Ting Chen, Taipei (TW);
Tzu-Chien Lai, Taipei (TW); I-Hsuan Tsai, Taipei (TW); Chien Chiu, Taipei (TW); I-Lung Chen, Taipei (TW);
Tsai-Sheng Yang, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 17/880,602

(22) Filed: Aug. 3, 2022

(65) Prior Publication Data

US 2023/0229213 A1    Jul. 20, 2023

(30) Foreign Application Priority Data

Jan. 14, 2022   (TW) .................................. 111101732

(51) Int. Cl.
*G06F 1/20* (2006.01)
*H05K 7/20* (2006.01)
*G06F 1/16* (2006.01)

(52) U.S. Cl.
CPC ............ *G06F 1/206* (2013.01); *G06F 1/1616* (2013.01); *G06F 1/1666* (2013.01);
(Continued)

(58) Field of Classification Search
CPC .... G06F 1/1616; G06F 1/1666; G06F 1/1667; G06F 1/1681; G06F 1/203; G06F 1/206;
(Continued)

(56) References Cited

U.S. PATENT DOCUMENTS 4,736,332 A * 4/1988 Crease .................. G06F 1/1615
361/679.09
5,552,960 A * 9/1996 Nelson .................... G06F 1/203
174/16.3

(Continued)

FOREIGN PATENT DOCUMENTS

CN    201810656    4/2011
TW    I418100      12/2013

(Continued)

OTHER PUBLICATIONS

"Office Action of Taiwan Counterpart Application", dated Jun. 20, 2022, p. 1-p. 10.

*Primary Examiner* — Adrian S Wilson
(74) *Attorney, Agent, or Firm* — JCIPRNET

(57) ABSTRACT

An electronic device includes a first body including a first part and a second part hinged to each other, a second body, and a hinge structure hinged between an edge of the second body and the second part. The first part has a recess. When the second body is unfolded relative to the first body from a folded state to a first unfolded state, the hinge structure pushes against the first part to rotate the first part relative to the second part. When the second body is continuously unfolded relative to the first body from the first unfolded state to a second unfolded state, the edge of the second body pushes against the first part, so that the first part continues to rotate relative to the second part. When the second body is in the folded state, the hinge structure is at least partially accommodated in the recess.

21 Claims, 18 Drawing Sheets

(52) U.S. Cl.
CPC ............ *G06F 1/1681* (2013.01); *G06F 1/203* (2013.01); *H05K 7/20154* (2013.01); *H05K 7/20172* (2013.01); *H05K 7/20209* (2013.01)

(58) Field of Classification Search
CPC ........... H05K 7/20154; H05K 7/20172; H05K 7/20209
See application file for complete search history.

(56) References Cited

U.S. PATENT DOCUMENTS

| | | | | |
|---|---|---|---|---|
| 6,437,978 | B1 * | 8/2002 | Ozaki | G06F 1/203 400/82 |
| 6,459,573 | B1 * | 10/2002 | DiStefano | G06F 1/203 361/679.46 |
| 6,496,369 | B2 * | 12/2002 | Nakamura | G06F 1/1656 312/236 |
| 6,612,668 | B2 * | 9/2003 | Doan | G06F 1/1616 16/303 |
| 6,930,881 | B2 * | 8/2005 | Karidis | G06F 1/1616 361/679.55 |
| 7,894,184 | B2 * | 2/2011 | Huang | G06F 1/1616 361/679.48 |
| 8,014,147 | B2 * | 9/2011 | Chen | G06F 1/1684 200/61.7 |
| 8,520,382 | B2 * | 8/2013 | Tye | G06F 1/203 248/688 |
| 8,937,806 | B2 * | 1/2015 | Senatori | G06F 1/203 361/694 |
| 8,976,524 | B2 * | 3/2015 | Wang | G06F 1/1656 361/679.48 |
| 9,104,374 | B2 * | 8/2015 | Tsai | G06F 1/1616 |
| 9,372,511 | B2 * | 6/2016 | Yeh | G06F 1/1669 |
| 9,582,048 | B2 * | 2/2017 | Ho | F16M 11/38 |
| 9,740,253 | B2 * | 8/2017 | Cheng | G06F 1/1681 |
| 9,983,636 | B2 * | 5/2018 | Ho | G06F 1/1616 |
| 10,241,540 | B2 * | 3/2019 | Chuang | G06F 1/203 |
| 10,289,176 | B1 * | 5/2019 | Chen | G06F 1/206 |
| 10,429,885 | B1 * | 10/2019 | Shaw | G06F 1/166 |
| 10,429,899 | B1 * | 10/2019 | Huang | G06F 1/1662 |
| 10,466,750 | B2 * | 11/2019 | Lee | G06F 1/165 |
| 10,534,408 | B2 * | 1/2020 | Cheng | G06F 1/1616 |
| 10,620,671 | B2 * | 4/2020 | Lai | G06F 1/1662 |
| 10,627,874 | B2 * | 4/2020 | Lin | G06F 1/1616 |
| 10,635,142 | B2 * | 4/2020 | Cheng | E05D 7/00 |
| 10,642,309 | B2 * | 5/2020 | Cheng | E05D 7/00 |
| 10,678,312 | B2 * | 6/2020 | Hsu | G06F 1/1616 |
| 10,788,854 | B1 * | 9/2020 | Liang | G06F 1/1681 |
| 11,132,026 | B2 * | 9/2021 | Yang | G06F 1/1647 |
| 11,579,655 | B2 * | 2/2023 | Townsend | G06F 1/1616 |
| 2012/0127652 | A1 * | 5/2012 | Lin | G06F 1/203 361/688 |
| 2012/0194977 | A1 * | 8/2012 | Liu | G06F 1/162 361/679.01 |
| 2014/0355190 | A1 * | 12/2014 | Yeh | G06F 1/1669 361/679.55 |
| 2018/0340648 | A1 * | 11/2018 | Chu | G06F 1/1626 |
| 2019/0317557 | A1 * | 10/2019 | Lai | G06F 1/1681 |
| 2020/0264672 | A1 * | 8/2020 | Morino | G06F 1/1616 |
| 2020/0356141 | A1 * | 11/2020 | Chen | G06F 1/1669 |
| 2021/0089077 | A1 * | 3/2021 | Wang | G06F 1/3287 |
| 2021/0165453 | A1 * | 6/2021 | Townsend | G06F 1/1616 |
| 2022/0357771 | A1 * | 11/2022 | Hung | G06F 1/1637 |

FOREIGN PATENT DOCUMENTS

| | | |
|---|---|---|
| TW | 201902327 | 1/2019 |
| TW | 202033084 | 9/2020 |
| TW | I704445 | 9/2020 |
| TW | 202042007 | 11/2020 |

\* cited by examiner

ELECTRONIC DEVICE

CROSS-REFERENCE TO RELATED APPLICATION

This application claims the priority benefit of Taiwan application serial no. 111101732, filed on Jan. 14, 2022. The entirety of the above-mentioned patent application is hereby incorporated by reference herein and made a part of this specification.

BACKGROUND

Technical Field

The disclosure relates to an electronic device; more particularly, the disclosure relates to an electronic device having more than one body.

Description of Related Art

Generally speaking, in order to dissipate heat, an electronic device (such as a notebook computer) is equipped with an air inlet and an air outlet. The air inlet is often located below a mainboard of the electronic device, and the air outlet is often located on a rear side surface of the mainboard of the electronic device away from a user, so as to exhaust the heat dissipating airflow in a direction away from the user.

However, the designed location of such air inlet and air outlet is easy to be covered when the user places the electronic device on a soft surface, such as on legs, a sofa, or a bed, so that the electronic device cannot effectively dissipate heat, thus leading to the temperature rise of the electronic device, lessening the comfort of using the electronic device, and affecting the processing performance of the electronic device. Therefore, how to prevent the air inlet and the air outlet of the electronic device from being covered in any state so that the electronic device is able to effectively dissipate the heat is one of the research directions in the pertinent field.

SUMMARY

The disclosure provides an electronic device having favorable heat dissipation efficiency.

In an embodiment of the disclosure, an electronic device including a first body, a second body, and a hinge structure is provided. The first body includes a first part and a second part hinged to each other, and the first part has a recess. The hinge structure is hinged between an edge of the second body and the second part. When the second body is unfolded relative to the first body from a folded state to a first unfolded state, the hinge structure pushes against the first part to rotate the first part relative to the second part. When the second body continues to be unfolded relative to the first body from the first unfolded state to a second unfolded state, the edge of the second body pushes against the first part, so that the first part continues to rotate relative to the second part. When the second body is in the folded state, the hinge structure is at least partially accommodated in the recess.

According to an embodiment of the disclosure, the first body includes a mainboard, and the mainboard is disposed in the first part.

According to an embodiment of the disclosure, the first body includes a battery, and the battery is disposed in the second part.

According to an embodiment of the disclosure, the second part includes a base part and an extension part, the first part is hinged to the base part, a first segment of the extension part is connected to a top end of the base part, a second segment of the extension part extends from the first segment and is located above the first part, and the hinge structure is hinged to the second segment and is at least partially located between the second segment and the first part.

According to an embodiment of the disclosure, the extension part is a keyboard component.

According to an embodiment of the disclosure, a gap exists between the first part and the second part, and a heat dissipation airflow is adapted to enter the first part through the gap. When the second body is unfolded from the folded state to the first unfolded state, the gap is expanded, and when the second body continues to be unfolded from the first unfolded state to the second unfolded state, the gap is further expanded.

According to an embodiment of the disclosure, the gap is located between a top surface of the first part and the second part. An air inlet is located on the top surface of the first part, and an air outlet is located on the top surface or a rear side surface of the first part.

According to an embodiment of the disclosure, the first body includes a fan, and the fan is disposed in the first part and adapted to generate a heat dissipation airflow. When the second body is in the folded state, the fan has a first rotation speed, when the second body is in the first unfolded state, the fan has a second rotation speed greater than the first rotation speed, and when the second body is in the second unfolded state, the fan has a third rotation speed greater than the second rotation speed.

According to an embodiment of the disclosure, the first body includes an elastic member, and the elastic member is connected between the first part and the second part. When the second body is unfolded relative to the first body, the first part resists an elastic force of the elastic member and rotates relative to the second part, and when the second body is in the folded state, the first part subject to the elastic force of the elastic member is restored.

According to an embodiment of the disclosure, the hinge structure has a polygonal profile if observed along a direction parallel to an axial direction of the hinge structure.

According to an embodiment of the disclosure, the hinge structure includes a circular structure and a polygonal structure, and the polygonal structure is connected to the circular structure.

According to an embodiment of the disclosure, the polygonal structure has a first side, one end of the first side is connected to the circular structure, and a first angle exists between the first side and a connecting line connecting the other end of the first side and a center of the circular structure.

According to an embodiment of the disclosure, the first angle ranges from 15 degrees to 30 degrees.

According to an embodiment of the disclosure, when the electronic device is in a first state, the hinge structure is not in contact with the recess, and the first state is the folded state.

According to an embodiment of the disclosure, the polygonal structure has a second side, one end of the second side is connected to the other end of the first side, and a second angle exists between the second side and a connecting line connecting the other end of the second side and the center of the circular structure.

According to an embodiment of the disclosure, the second angle ranges from 45 degrees to 55 degrees.

According to an embodiment of the disclosure, when the electronic device is in a second state, the other end of the first side and the one end of the second side are in contact with the recess.

According to an embodiment of the disclosure, the polygonal structure has a third side, one end of the third side is connected to the other end of the second side, and a third angle exists between the third side and a connecting line connecting the other end of the third side and the center of the circular structure.

According to an embodiment of the disclosure, the third angle ranges from 85 degrees to 95 degrees.

According to an embodiment of the disclosure, when the electronic device is in a third state, the other end of the second side and the one end of the third side are in contact with the recess.

According to an embodiment of the disclosure, when the electronic device is in a fourth state, the other end of the third side is in contact with the first part.

In view of the above, in the electronic device provided in one or more embodiments of the disclosure, the hinge structure pushes against the first part to rotate the first part relative to the second part, whereby the electronic device is unfolded to be in the first unfolded state. The edge of the second body of the electronic device then pushes against the first part, so that the first part continues to rotate relative to the second part, and the electronic device is unfolded to be in the second unfolded state. As such, the gap between the first part and the second part is gradually expanded together with the unfolding operations of the first part and the second part, the heat dissipation airflow is allowed to enter the electronic device through the gap, and hence the electronic device in any state is capable of dissipating the heat effectively. As a result, the comfort of using the electronic device and the processing performance of the electronic device may be guaranteed.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
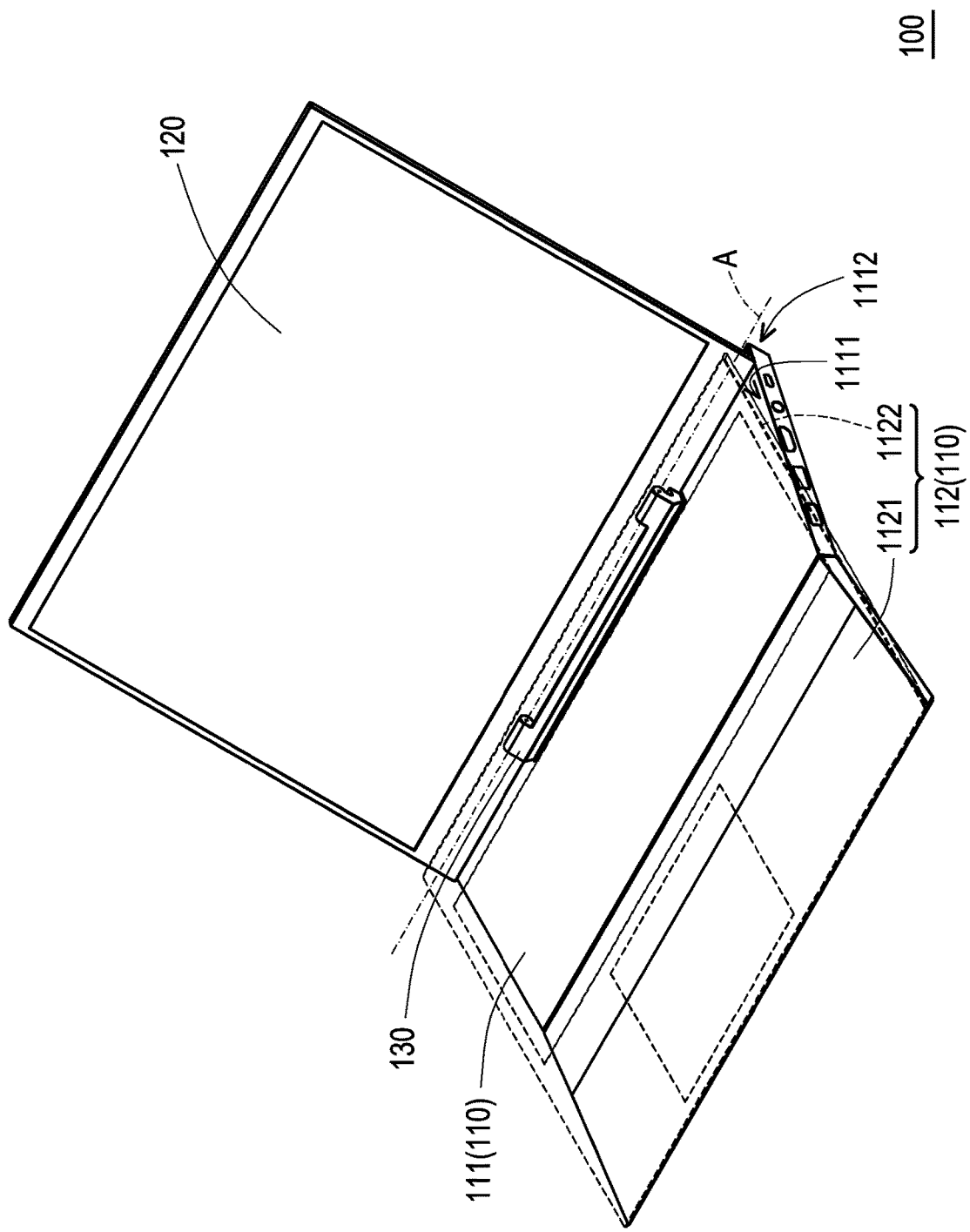
FIG. 1 is a three-dimensional view of an electronic device according to an embodiment of the disclosure.
Figure 2:
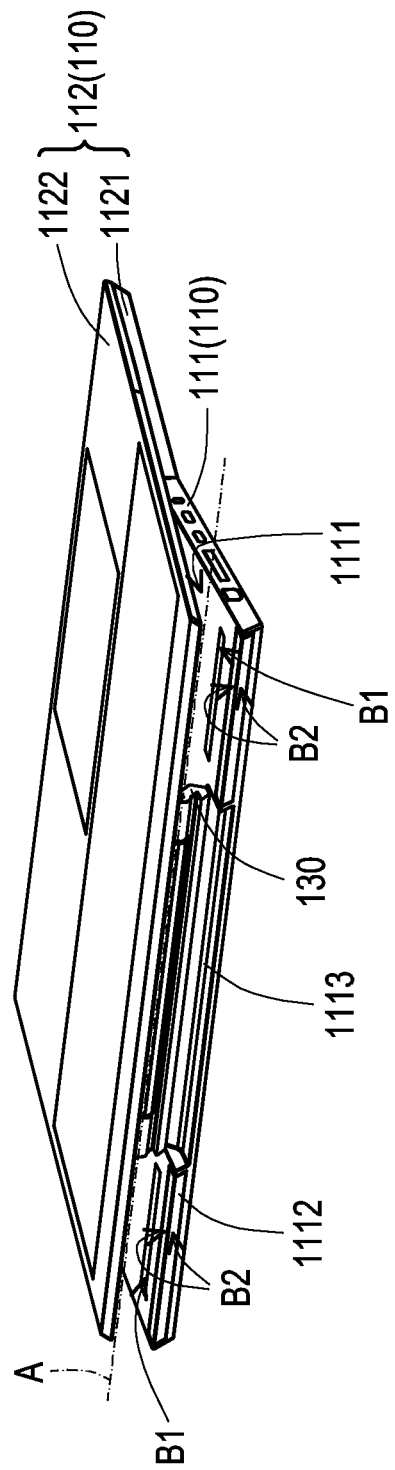
FIG. 2 is a three-dimensional view of some components in the electronic device depicted in FIG. 1 at another view angle.

FIG. 1 is a three-dimensional view of an electronic device according to an embodiment of the disclosure. FIG. 2 is a three-dimensional view of some components in the electronic device depicted in FIG. 1 at another view angle. With reference to FIG. 1 and FIG. 2, an electronic device 100 provided in this embodiment includes a first body 110, a second body 120, and a hinge structure 130. The first body 110 includes a first part 111 and a second part 112 hinged to each other, and the hinge structure 130 is hinged between an edge 121 of the second body 120 and the second part 112.

Figure 3A:
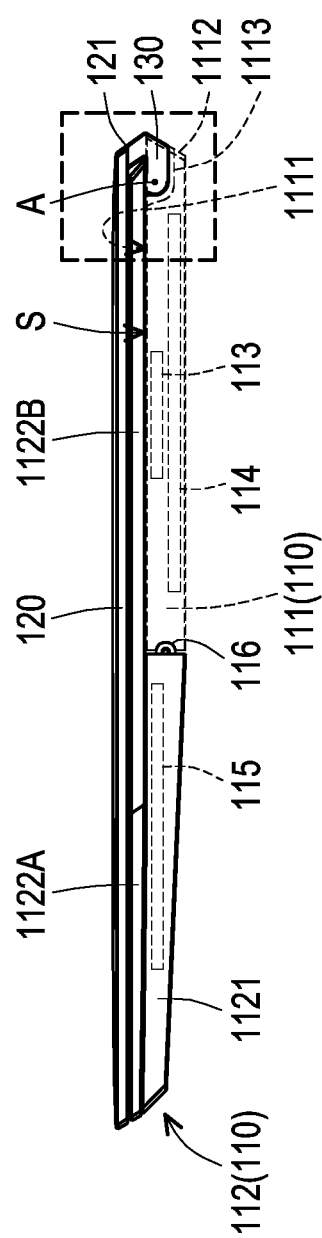
FIG. 3A to FIG. 3D are side views of various operating states of the electronic device depicted in FIG. 1.
Figure 3B:
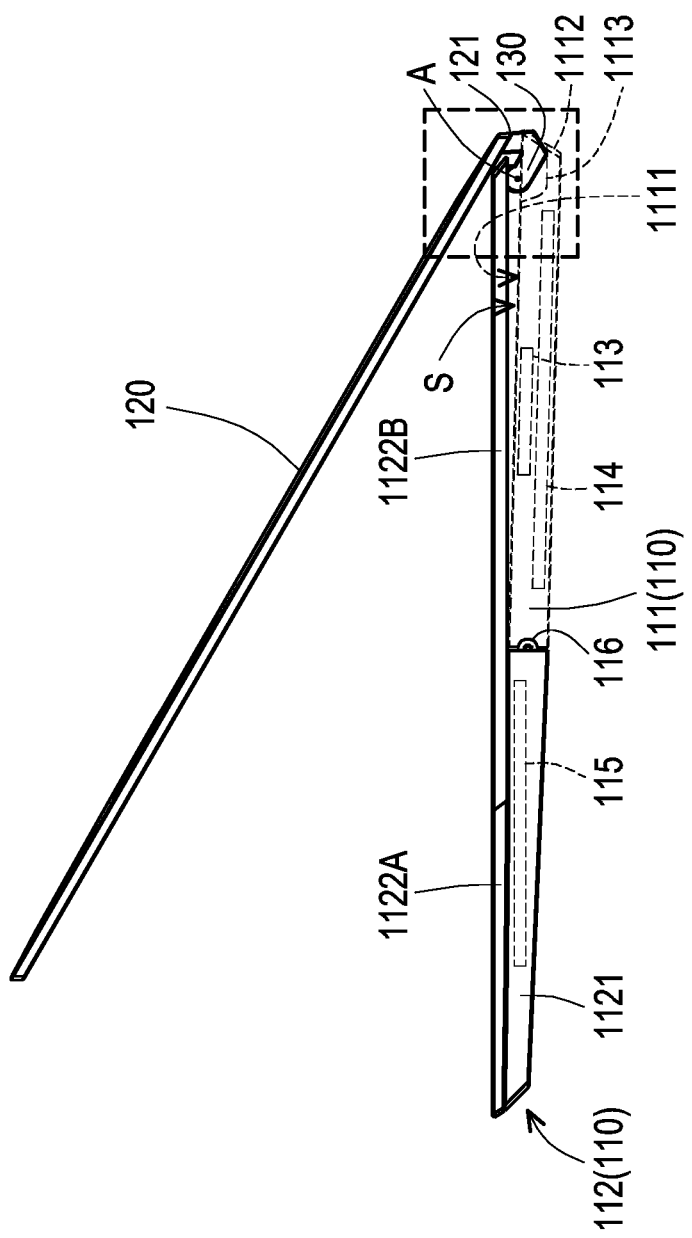
Figure 3C:
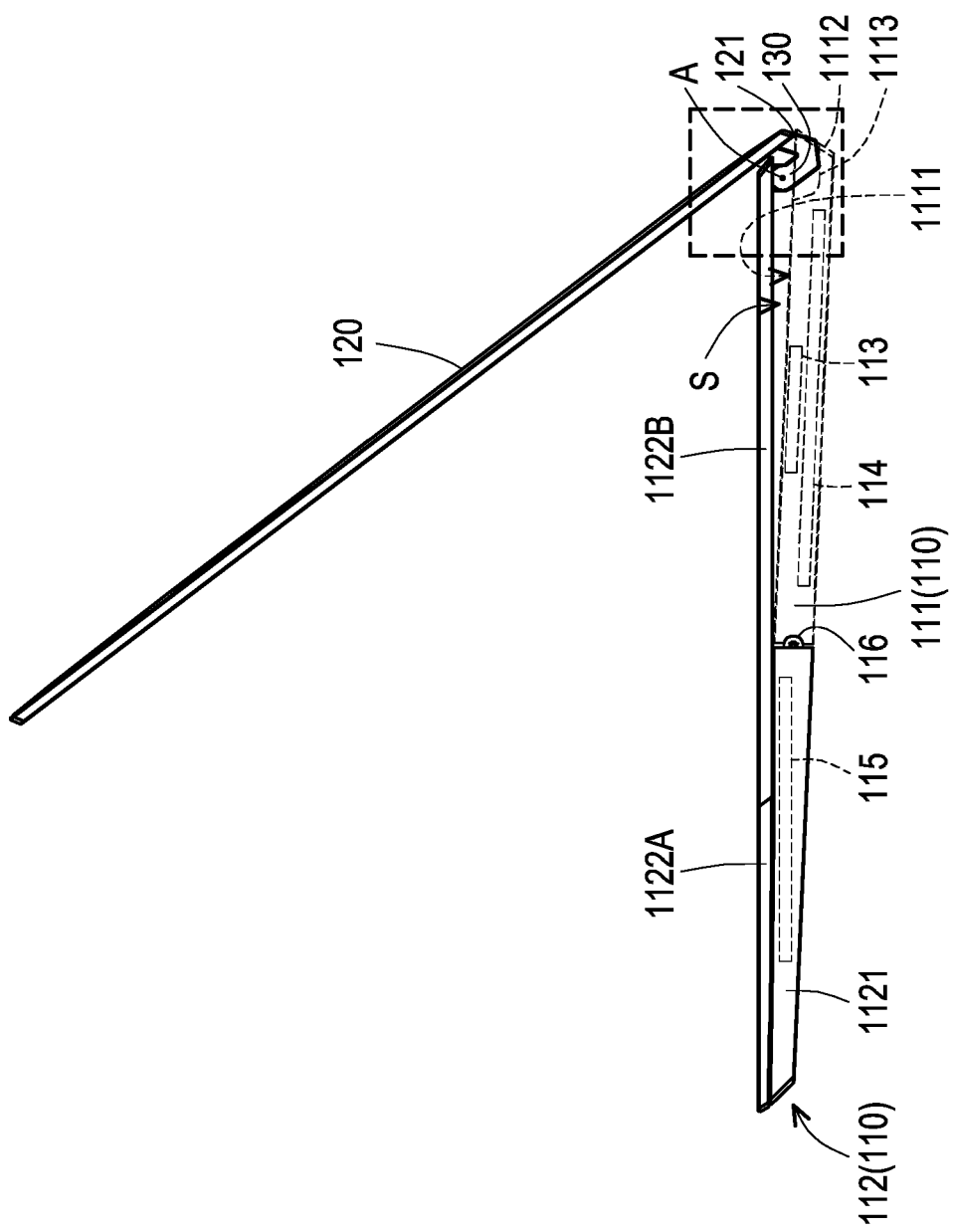
Figure 3D:
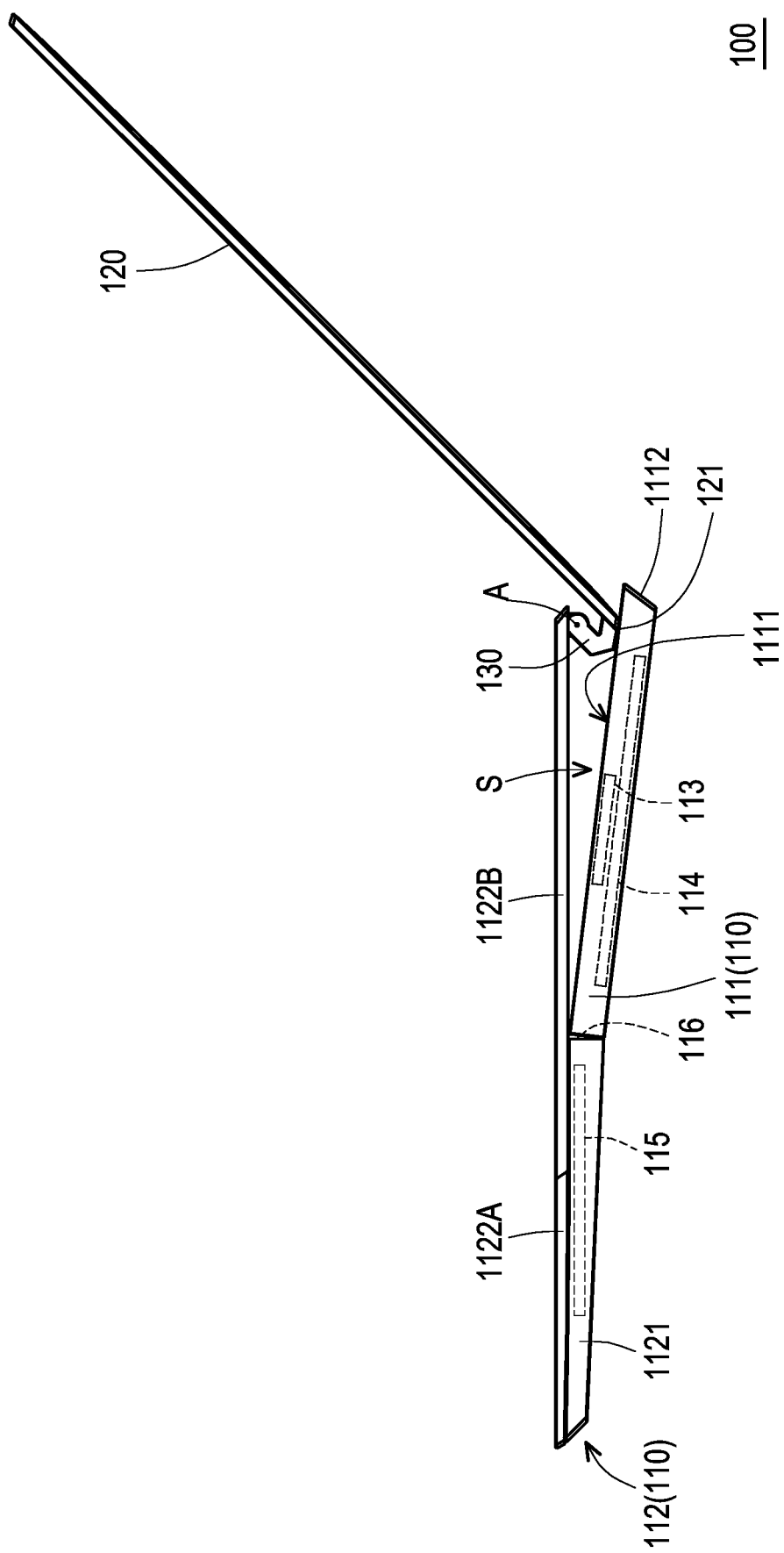

FIG. 3A to FIG. 3D are side views of various operating states of the electronic device depicted in FIG. 1. With reference to FIG. 2 to FIG. 3D, when the second body 120 is unfolded relative to the first body 110 from a folded state shown in FIG. 3A to a first unfolded state shown in FIG. 3B, the hinge structure 130 pushes against the first part 111 to rotate the first part 111 relative to the second part 112. When the second body 120 is unfolded relative to the first body 110 from the first unfolded state shown in FIG. 3C to a second unfolded state shown in FIG. 3D, the edge 121 of the second body 120 pushes against the first part 111, so that the first part 111 continues to rotate relative to the second part 112 until the second body 120 is unfolded relative to the first body 110 to a more unfolded state as shown in FIG. 3D.

As such, a gap S between the first part 111 and the second part 112 is gradually expanded as the electronic device 100 is unfolded from the folded state to the second unfolded state, and a heat dissipation airflow is allowed to enter the electronic device 100 from the outside through the gap S. Thereby, the electronic device 100 in any state may effectively dissipate heat, so as to ensure the comfort of using the electronic device 100 and the processing performance of the electronic device 100.

Specifically, the second part 112 provided in this embodiment includes a base part 1121 and an extension part 1122, and the extension part 1122 includes a first segment 1122A and a second segment 1122B. The first part 111 is hinged to the base part 1121, the first segment 1122A of the extension part 1122 is connected to a top end of the base part 1121, and the second segment 1122B of the extension part 1122 extends from the first segment 1122A and is located above the first part 111. The hinge structure 130 is hinged to the second segment 1122B with respect to a rotation axis A as the axis and is at least partially located between the second segment 1122B and the first part 111.

The gap S provided in this embodiment is located between a top surface 1111 of the first part 111 and the second segment 1122B of the second part 112. The heat dissipation airflow is adapted to enter the first part 111 through the gap S. An air inlet B1 is located on the top surface 1111 of the first part 111, and an air outlet B2 is located on the top surface 1111 or a rear side surface 1112 of the first part 111. When the second body 120 is unfolded from the folded state to the first unfolded state, the gap S is expanded, and when the second body 120 continues to be unfolded from the first unfolded state to the second unfolded state, the gap S is further expanded.

In addition, the first body 110 provided in this embodiment includes a fan 113 disposed in the first part 111 and adapted to generate the heat dissipation airflow. When the second body 120 is in the folded state as shown in FIG. 3A, the fan 113 has a first rotation speed. When the second body 120 is in the first unfolded state as shown in FIG. 3B and FIG. 3C, the fan 113 has a second rotation speed greater than the first rotation speed. When the second body 120 is in the second unfolded state as shown in FIG. 3D, the fan 113 has a third rotation speed greater than the second rotation speed. A flow rate of the heat dissipation airflow is affected by the different rotation speeds of the fan 113. When the second body 120 is in the second unfolded state, the gap S has the maximum value, and the third rotation speed of the fan 113 is also the maximum rotation speed, whereby the heat dissipation airflow may flow into the air inlet B1 of the first part 111 more efficiently, cool down the electronic components in the first part 111, and then flow out from the air outlet B2, so as to ensure the processing performance of the electronic device 100 in use. By contrast, when the second body 120 is in the folded state, although the gap S has the minimum value, and the first rotation speed of the fan is also the minimum rotation speed, the heat dissipation airflow may still flow into the air inlet B1 of the first part 111, cool down the electronic components in the first part 111, and then flow out from the air outlet B2, so that the second body 120 in any state is able to effectively dissipate the heat.

FIG. 4A to FIG. 4D are partial enlarged views of the electronic device depicted in FIG. 3A to FIG. 3D. With reference to FIG. 4A to FIG. 4D, in the electronic device 100 provided in this embodiment, the hinge structure 130, if observed alone a direction parallel to an axial direction of the rotation axis A of the hinge structure 130, has a polygonal profile that is eccentric to the rotation axis A. The first part 111 has a recess 1113. When the second body 120 is in a folded state shown in FIG. 4A, the hinge structure 130 is at least partially accommodated in the recess 1113. When the second body 120 is unfolded relative to the first body 110 to a first unfolded state shown in FIG. 4B, the polygonal profile of the hinge structure 130 pushes against the recess 1113 of the first part 111 to rotate the first part 111 relative to the second part 112. When the second body 120 continues to be unfolded relative to the first body 110 to a second unfolded state shown in FIG. 4C and a more unfolded state shown in FIG. 4D, the polygonal profile of the hinge structure 130 no longer pushes against the first part 111; instead, the edge 121 of the second body 120 pushes against the first part 111. In other embodiments, the hinge structure 130 may have other eccentric profiles of different types, which should not be construed as a limitation in the disclosure.

As mentioned above, in the step of unfolding the second body 120 relative to the first body 110 from the folded state to the first unfolded state, the hinge structure 130 pushes against the recess 1113 of the first part 111 to drive the second body 120 and the first body 110 to be pivotally rotated relative to each other; after that, in the step of unfolding the second body 120 relative to the first body 110 from the first unfolded state to the second unfolded state, the edge 121 pushes against the first part 111 to drive the 130, has second body 120 and the first body 110 to be pivotally rotated relative to each other. That is to say, in the entire operation process, the hinge structure 130 does not always push against the recess 1113 of the first part 111, and therefore it is not necessary to apply a more eccentric profile to the hinge structure 130 for ensuring the hinge structure 130 to continue to push against the recess 1113 of the first part during the entire operation process. Thereby, the hinge structure 130 may be effectively reduced in size, and the linear profile of the hinge structure 130 may conform to the outer profiles of the first part 111 and the second body 120, so that the overall appearance of the electronic device 100 may be more pleasing.

In this embodiment, the first body 110 includes a mainboard 114 and a battery 115 as shown in FIG. 3A to FIG. 3D, which are respectively disposed in the first part 111 and the second part 112, and the extension part 1122 of the second part 112 is a keyboard component. Since the mainboard 114 and the battery 115 are respectively disposed on the first part 111 and the second part 112 of the first body 110, the battery 115 may not be easily subject to the heat generated by the mainboard 114 when the electronic device 100 is in use. As such, the issue of the increase in temperature of the battery 115 and the difficulty in heat dissipation may be prevented, and the battery 115 may have an extended service life.

In this embodiment, the first body 110 includes an elastic member 116 connected between the first part 111 and the second part 112. When the second body 120 is unfolded relative to the first body 110 to the first unfolded state and the second unfolded state, the first part 111 resists the elastic force of the elastic member 116 and rotates relative to the second part 112. When the second body 120 is in the folded state, the first part 111 subject to the elastic force of the elastic member 116 is restored. The elastic member 116 provided in this embodiment is a torsion spring, which should however not be construed as a limitation in the disclosure.

Figure 4A:
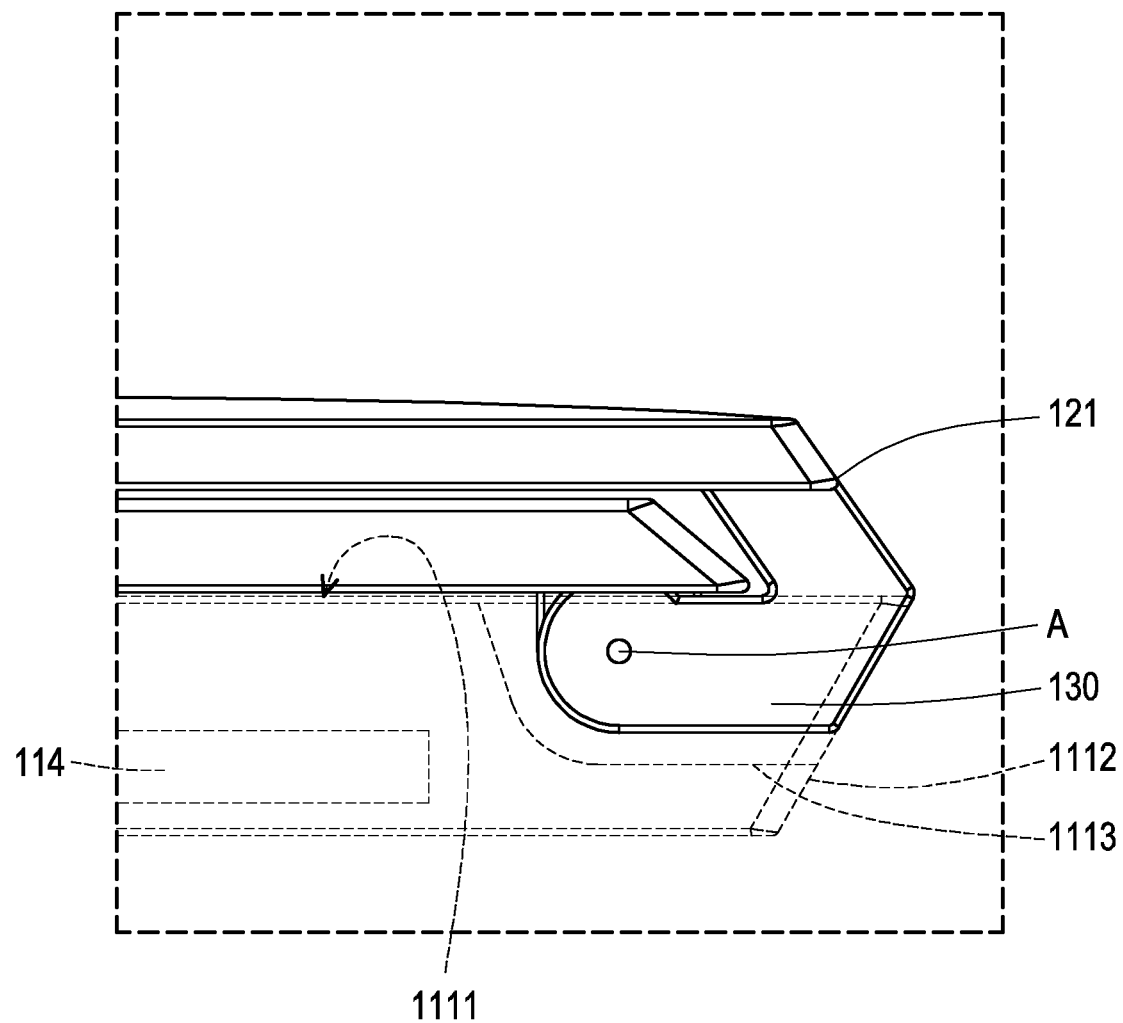
FIG. 4A to FIG. 4D are partial enlarged views of the electronic device depicted in FIG. 3A to FIG. 3D.
Figure 4B:
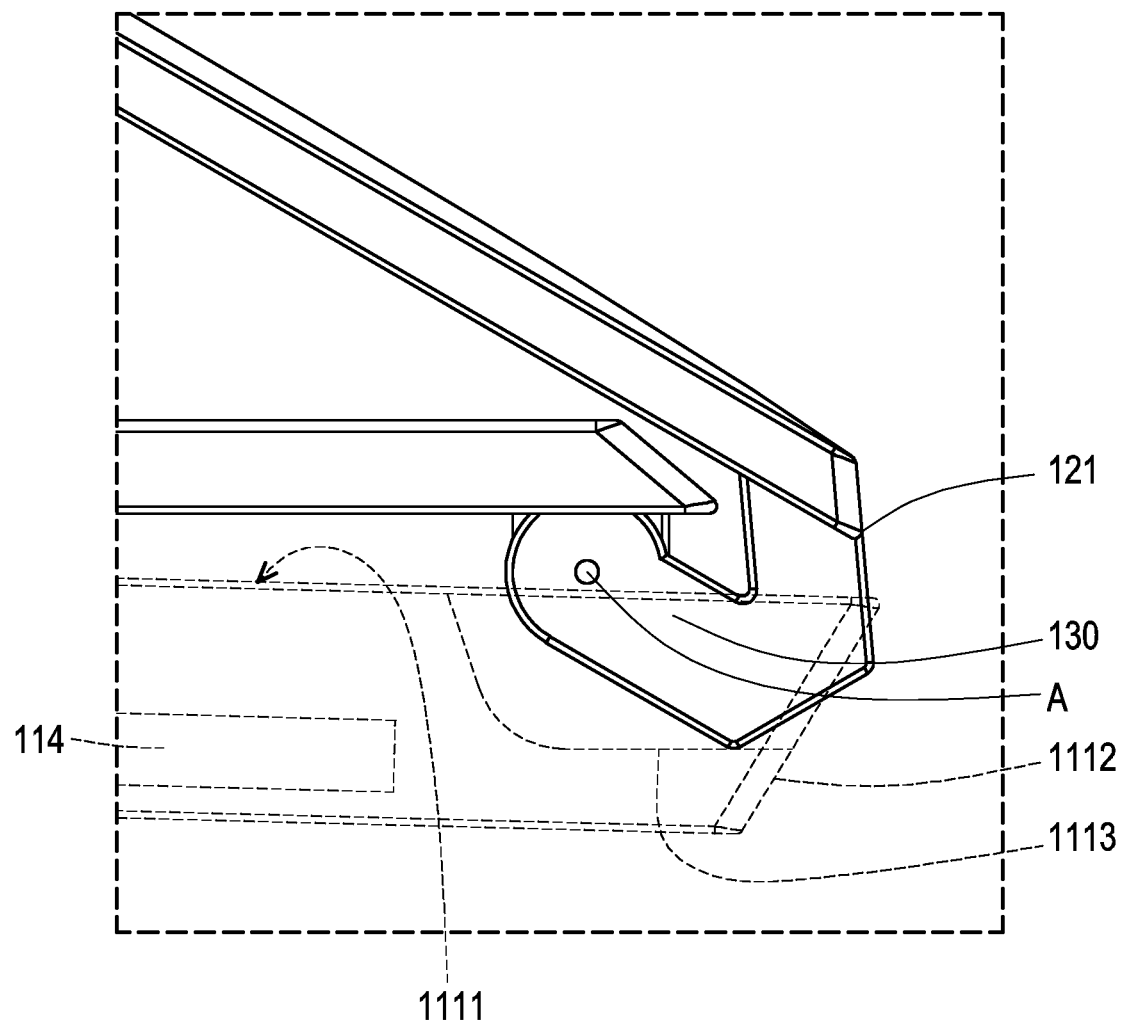
Figure 4C:
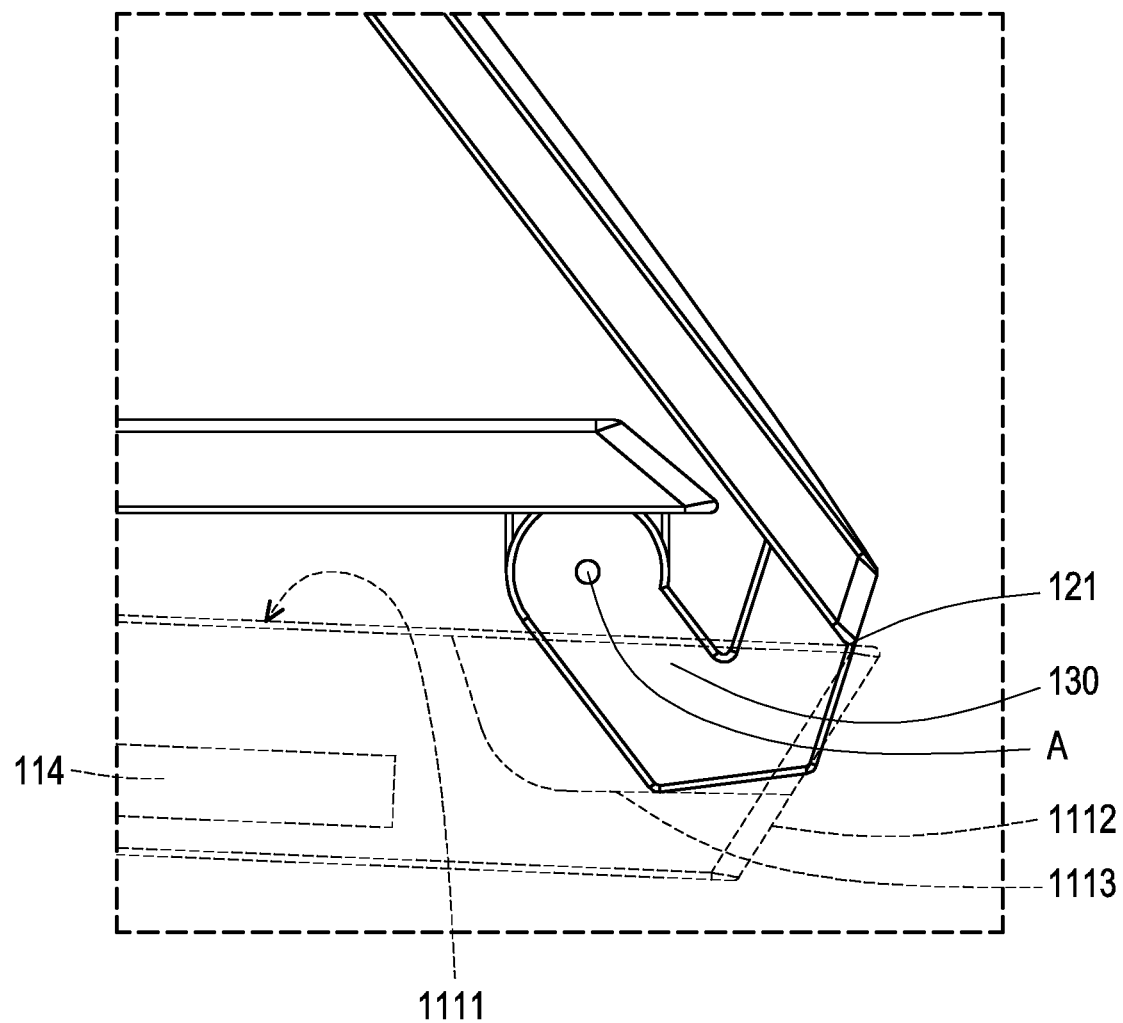

In this embodiment, when the electronic device 100 is in a first state P1 as shown in FIG. 4A, the hinge structure 130 is not in contact with the recess 1113. The first state P1 is the same as the folded state shown in FIG. 4A.

Figure 5A:
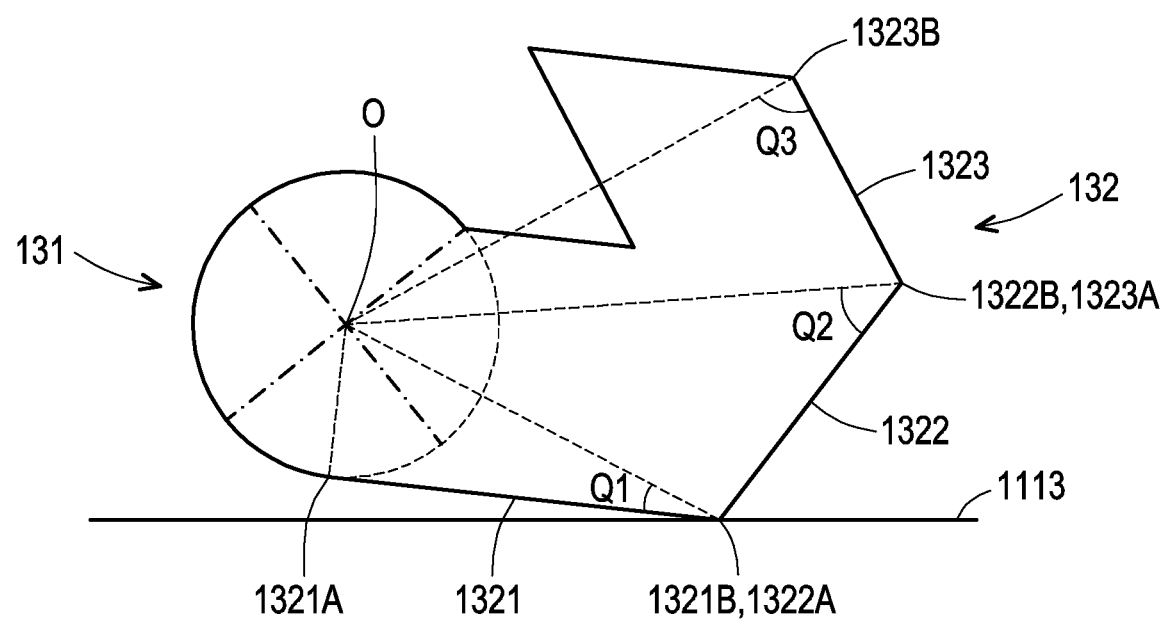
FIG. 5A and FIG. 5B are schematic views illustrating the hinge structure depicted in FIG. 1 is in a second state.
Figure 5B:
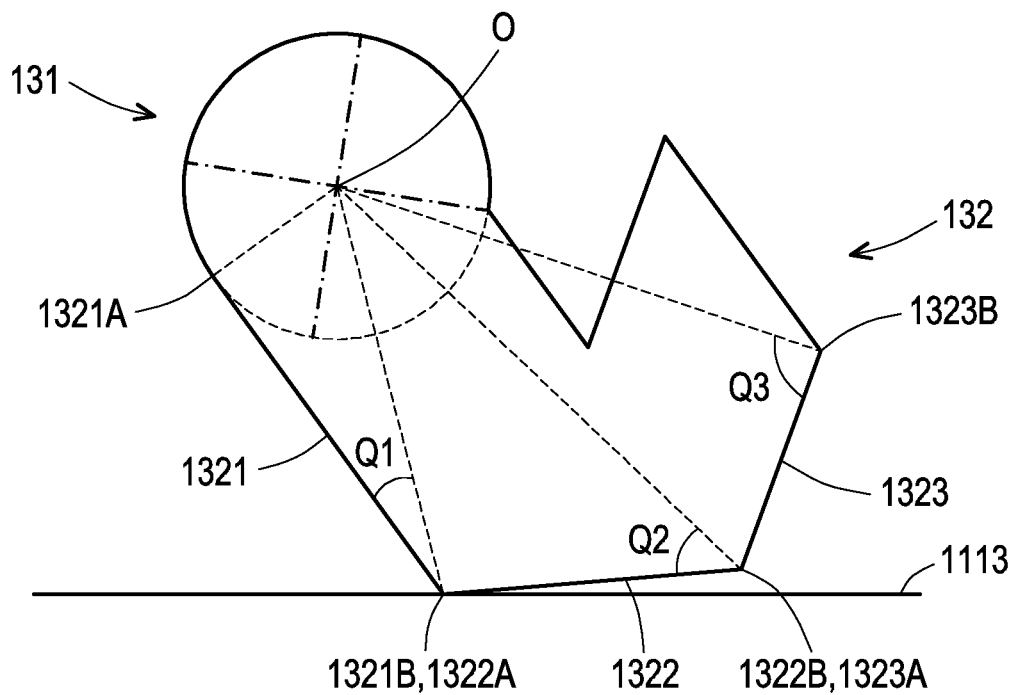

FIG. 5A and FIG. 5B are schematic views illustrating the hinge structure depicted in FIG. 1 is in a second state. With reference to FIG. 1, FIG. 5A, and FIG. 5B, the hinge structure 130 provided in the embodiment includes a circular structure 131 and a polygonal structure 132, and the polygonal structure 132 is connected to the circular structure 131. The polygonal structure 132 has a first side 1321, a second side 1322, and a third side 1323. One end 1321A of the first side 1321 is connected to the circular structure 131, and a first angle Q1 exists between the first side 1321 and a connecting line connecting the other end 1321B of the first side 1321 and a center O of the circular structure 131. Here, the first angle Q1 ranges from 15 degrees to 30 degrees. One end 1322A of the second side 1322 is connected to the other end 1321B of the first side 1321, and a second angle Q2 exists between the second side 1322 and a connecting line connecting the other end 1322B of the second side 1322 and the center O of the circular structure 131. Here, the second angle Q2 ranges from 45 degrees to 55 degrees. One end 1323A of the third side 1323 is connected to the other end 1322B of the second side 1322, and a third angle Q3 exists between the third side 1323 and a connecting line connecting the other end 1323B of the third side 1323 and the center O of the circular structure 131. Here, the third angle Q3 ranges from 85 degrees to 95 degrees.

In light of the above, when the electronic device 100 provided in the embodiment is in a second state P2 as shown in FIG. 5A and FIG. 5B, the other end 1321B of the first side 1321 and the end 1322A of the second side 1322 are in contact with the recess 1113. The second state P2 is the same as the aforesaid first unfolded state.

Figure 5C:
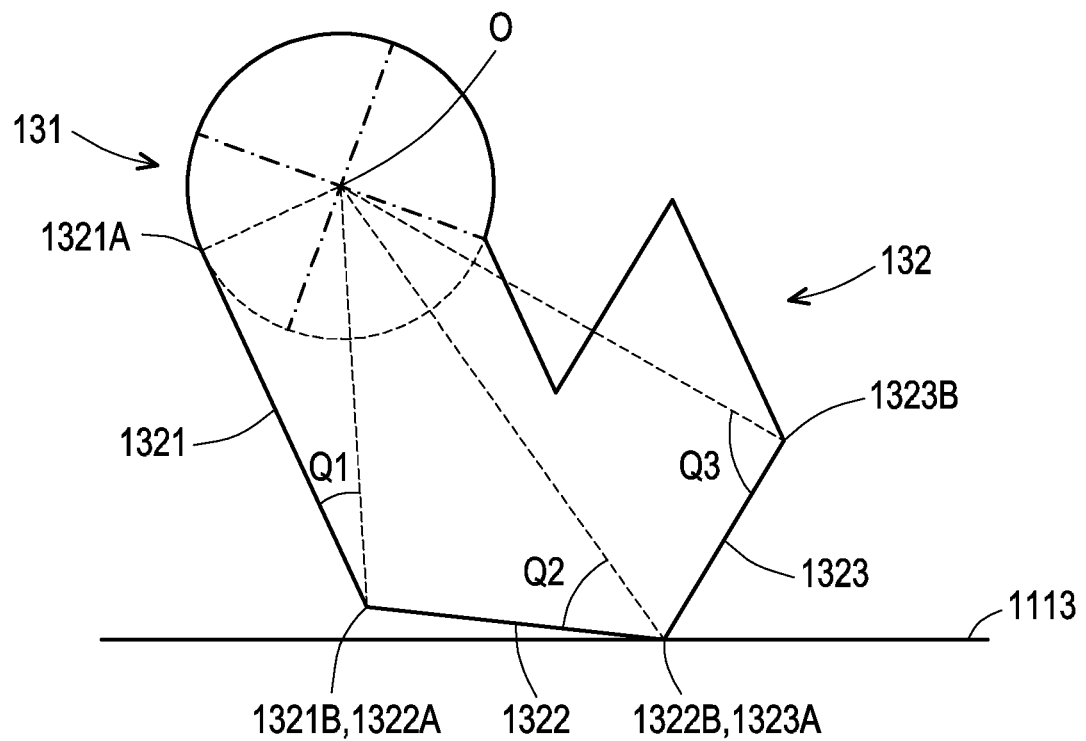
FIG. 5C and FIG. 5D are schematic views illustrating the hinge structure depicted in FIG. 1 is in a third state.
Figure 5D:
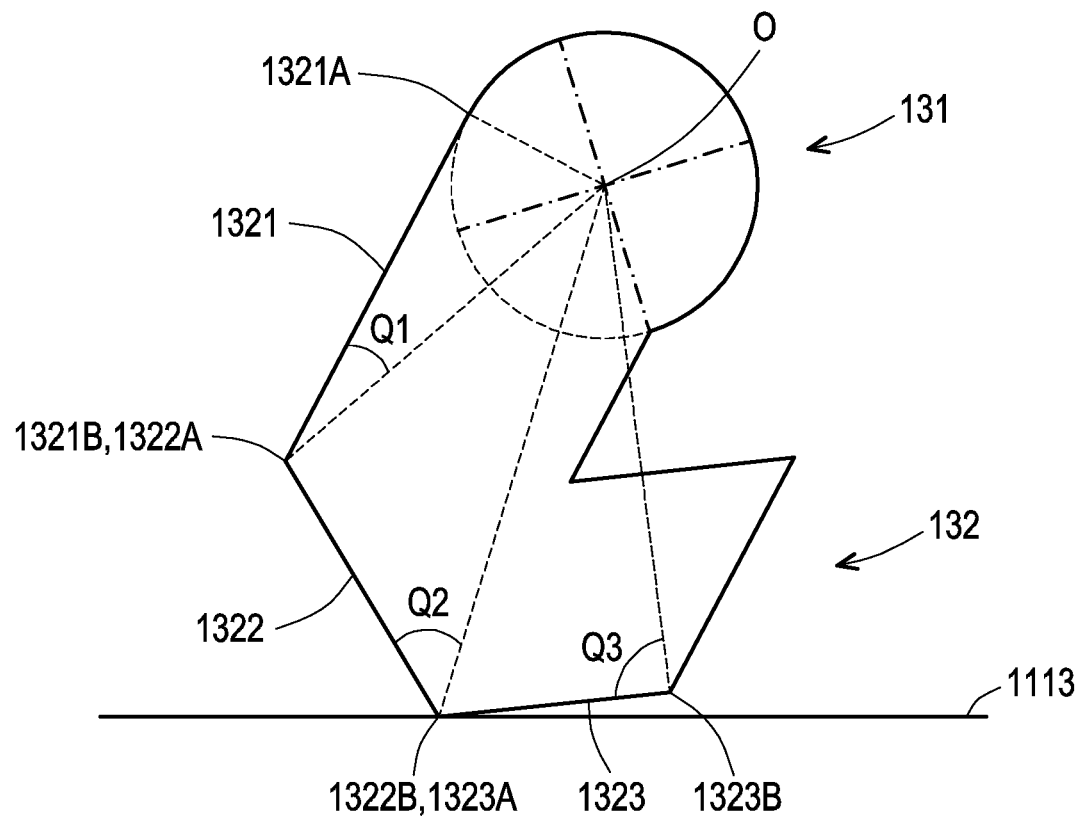

FIG. 5C and FIG. 5D are schematic views illustrating the hinge structure depicted in FIG. 1 is in a third state. With reference to FIG. 1, FIG. 5C, and FIG. 5D, when the electronic device 100 provided in this embodiment is in a third state P3, the other end 1322B of the second side 1322 and the end 1323A of the third side 1323 are in contact with the recess 1113. The aforesaid second unfolded state includes the third state P3.

Figure 4D:
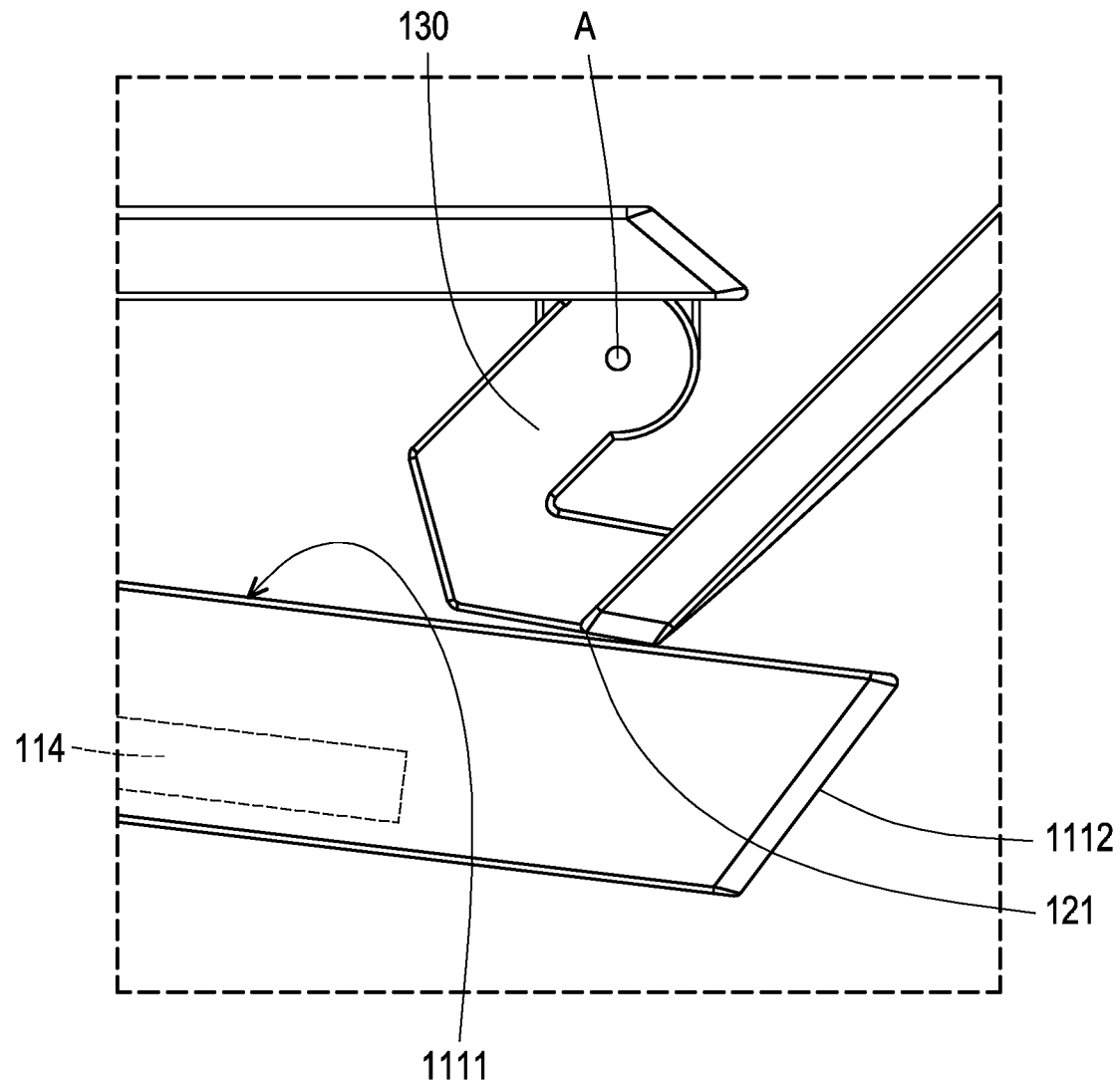
Figure 5E:
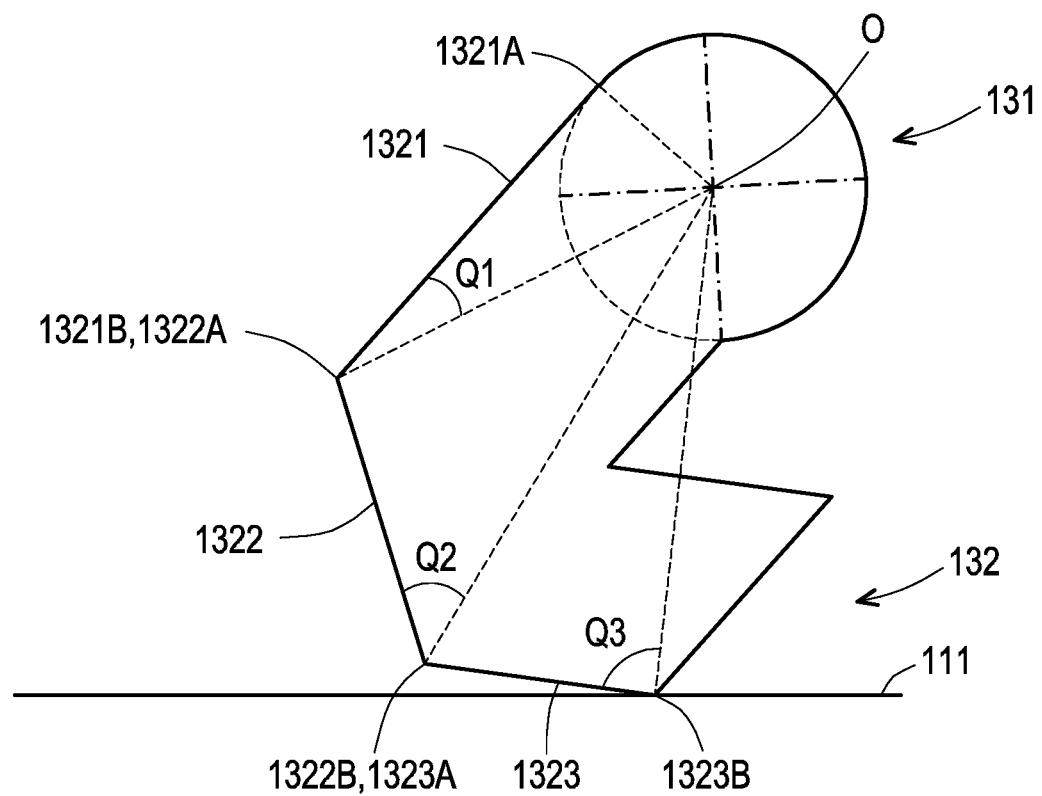
FIG. 5E is a schematic view illustrating the hinge structure depicted in FIG. 1 is in a fourth state.

FIG. 5E is a schematic view illustrating the hinge structure depicted in FIG. 1 is in a fourth state. With reference to FIG. 1, FIG. 4D, and FIG. 5E, when the electronic device 100 is in a fourth state P4, the other end 1323B of the third side 1323 is in contact with the first part 111. The aforesaid second unfolded state includes the fourth state P4, and the fourth state P4 is the same as the aforesaid second unfolded state that is more unfolded as shown in FIG. 4D.

Figure 6A:
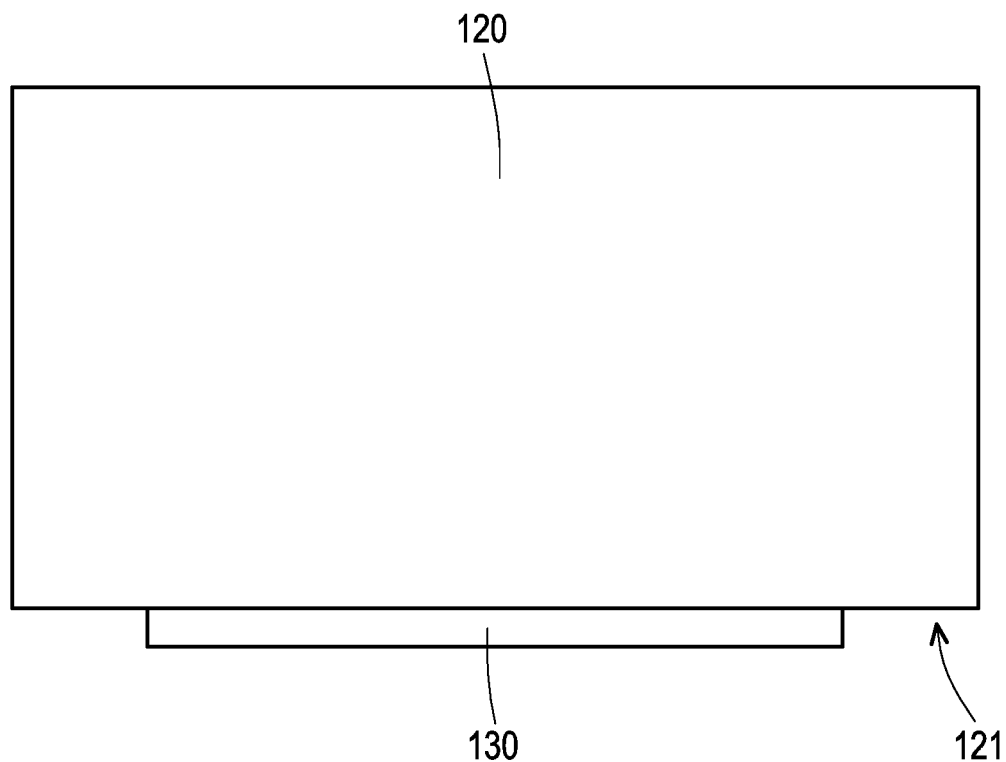
FIG. 6A is a schematic top view of a second body and a hinge structure of the electronic device depicted in FIG. 1.

FIG. 6A is a schematic top view of a second body and a hinge structure of the electronic device depicted in FIG. 1. With reference to FIG. 6A, the second body 120 and the hinge structure 130 provided in this embodiment are two independent components, and the hinge structure 130 is connected to the edge 121 of the second body 120.

Figure 6B:
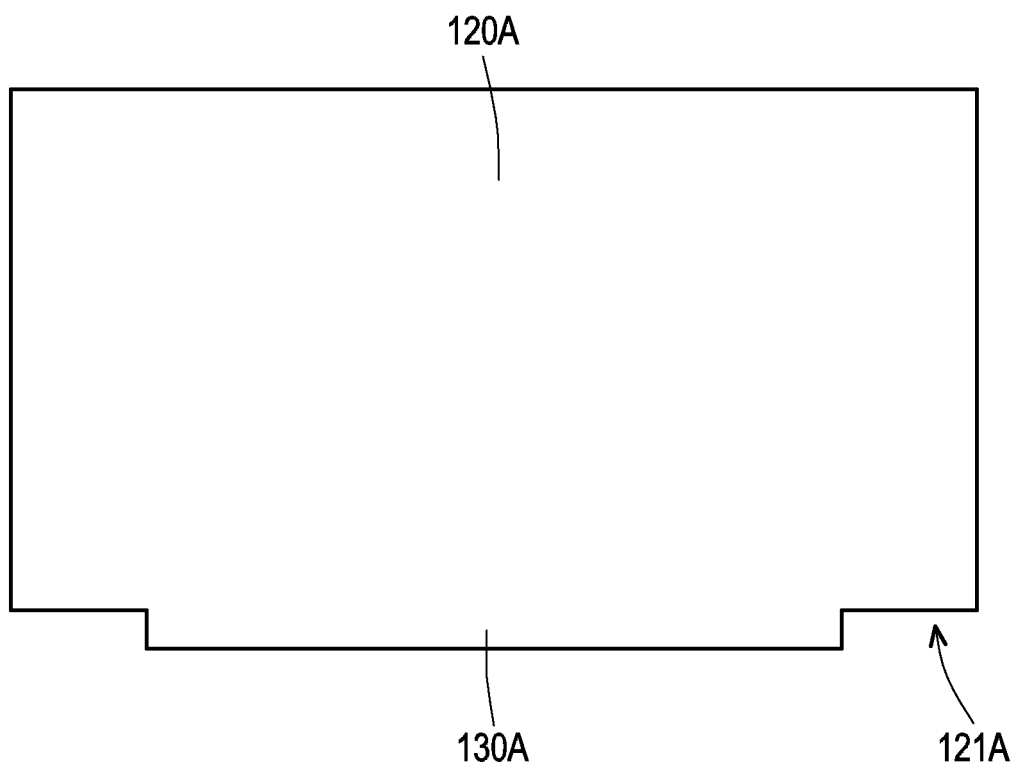
FIG. 6B is a schematic top view of a second body and a hinge structure according to another embodiment of the disclosure.
Figure 6C:
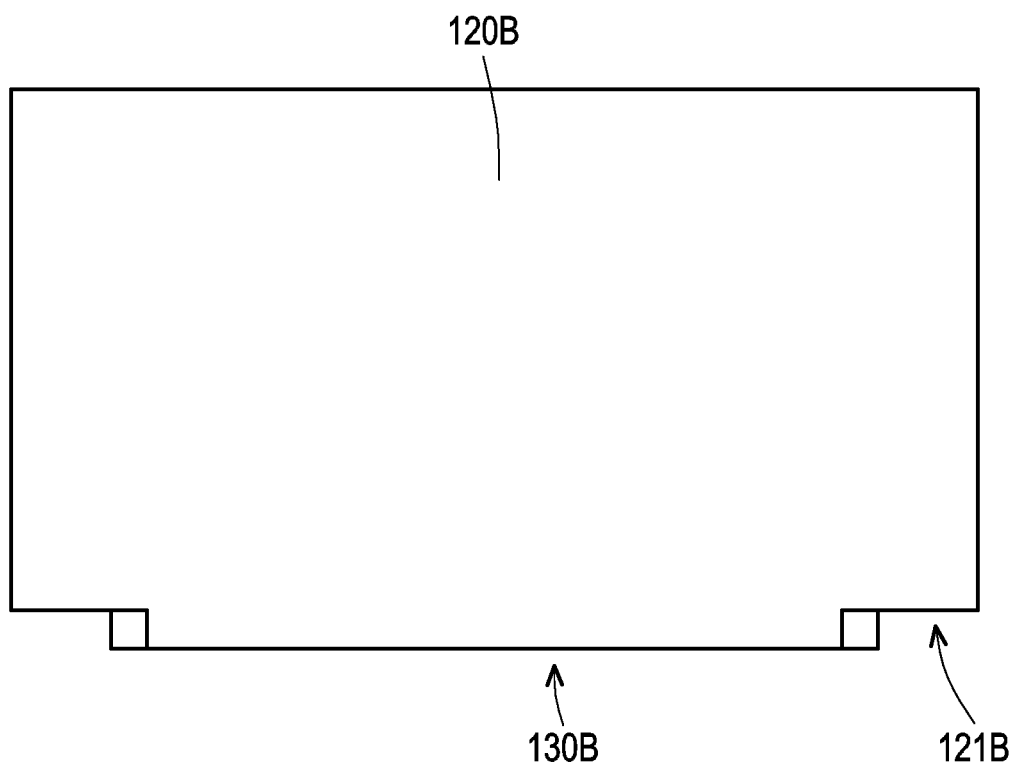
FIG. 6C is a schematic top view of a second body and a hinge structure according to another embodiment of the disclosure.

FIG. 6B is a schematic top view of a second body and a hinge structure according to another embodiment of the disclosure. The difference between a second body 120A and a hinge structure 130A provided in this embodiment shown in FIG. 6B and the second body 120 and the hinge structure 130 provided in the embodiment shown in FIG. 6A lies in that the second body 120A and the hinge structure 130A shown in FIG. 6B are integrally formed. FIG. 6C is a schematic top view of a second body and a hinge structure according to another embodiment of the disclosure. The difference between a second body 120B and a hinge structure 130B provided in this embodiment shown in FIG. 6C and the second body 120 and the hinge structure 130 provided in the embodiment shown in FIG. 6A lies in that the second body 120B and the hinge structure 130B shown in FIG. 6C are partially integrally formed, i.e., the hinge structure 130B and the second body 120B near the two short sides of the second body 120B are designed as two independent components.

To sum up, in the electronic device provided in one or more embodiments of the disclosure, the hinge structure pushes against the first part to rotate the first part relative to the second part, whereby the electronic device is unfolded to be in the first unfolded state. The edge of the second body of the electronic device then pushes against the first part, so that the first part continues to rotate relative to the second part, and the electronic device is unfolded to be in the second unfolded state. As such, the gap between the first part and the second part is gradually expanded together with the unfolding operation of the electronic device, the heat dissipation airflow is allowed to enter the electronic device through the gap, and hence the electronic device in any state is capable of dissipating the heat effectively. As a result, the comfort of using the electronic device and the processing performance of the electronic device may be guaranteed.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An electronic device, comprising:
   a first body, comprising a first part and a second part hinged to each other, wherein the first part has a recess;
   a second body; and
   a hinge structure, hinged between the second body and the second part, wherein when the second body is unfolded relative to the first body from a folded state to a first unfolded state, the hinge structure pushes against the first part to rotate the first part relative to the second part, when the second body continues to be unfolded relative to the first body from the first unfolded state to a second unfolded state, the second body pushes against the first part, so that the first part continues to rotate relative to the second part, and when the second body is in the folded state, the hinge structure is at least partially accommodated in the recess.

2. The electronic device according to claim 1, wherein the first body comprises a mainboard, and the mainboard is disposed in the first part.

3. The electronic device according to claim 1, wherein the first body comprises a battery, and the battery is disposed in the second part.

4. The electronic device according to claim 1, wherein the second part comprises a base part and an extension part, the first part is hinged to the base part, a first segment of the extension part is connected to a top end of the base part, a second segment of the extension part extends from the first segment and is located above the first part, and the hinge structure is hinged to the second segment and is at least partially located between the second segment and the first part.

5. The electronic device according to claim 4, wherein the extension part is a keyboard component.

6. The electronic device according to claim 1, wherein a gap exists between the first part and the second part, a heat dissipation airflow is adapted to enter the first part through the gap, when the second body is unfolded from the folded state to the first unfolded state, the gap is expanded, and when the second body continues to be unfolded from the first unfolded state to the second unfolded state, the gap is further expanded.

7. The electronic device according to claim 6, wherein the gap is located between a top surface of the first part and the second part, an air inlet is located on the top surface of the first part, and an air outlet is located on the top surface or a rear side surface of the first part.

8. The electronic device according to claim 1, wherein the first body comprises a fan, the fan is disposed in the first part and adapted to generate a heat dissipation airflow, when the second body is in the folded state, the fan has a first rotation speed, when the second body is in the first unfolded state, the fan has a second rotation speed greater than the first rotation speed, and when the second body is in the second unfolded state, the fan has a third rotation speed greater than the second rotation speed.

9. The electronic device according to claim 1, wherein the first body comprises an elastic member, the elastic member is connected between the first part and the second part, when the second body is unfolded relative to the first body, the first part resists an elastic force of the elastic member and rotates relative to the second part, and when the second body is in the folded state, the first part subject to the elastic force of the elastic member is restored.

10. The electronic device according to claim 1, wherein the hinge structure has a polygonal profile if observed along a direction parallel to an axial direction of the hinge structure.

11. The electronic device according to claim 1, wherein the hinge structure comprises a circular structure and a polygonal structure, and the polygonal structure is connected to the circular structure.

12. The electronic device according to claim 11, wherein the polygonal structure has a first side, one end of the first side is connected to the circular structure, and a first angle exists between the first side and a connecting line connecting the other end of the first side and a center of the circular structure.

13. The electronic device according to claim 12, wherein the first angle ranges from 15 degrees to 30 degrees.

14. The electronic device according to claim 12, wherein when the electronic device is in a first state, the hinge structure is not in contact with the recess, and the first state is the folded state.

15. The electronic device according to claim 12, wherein the polygonal structure has a second side, one end of the second side is connected to the other end of the first side, and a second angle exists between the second side and a connecting line connecting the other end of the second side and the center of the circular structure.

16. The electronic device according to claim 15, wherein the second angle ranges from 45 degrees to 55 degrees.

17. The electronic device according to claim 15, wherein when the electronic device is in a second state, the other end of the first side and the one end of the second side are in contact with the recess.

18. The electronic device according to claim 15, wherein the polygonal structure has a third side, one end of the third side is connected to the other end of the second side, and a third angle exists between the third side and a connecting line connecting the other end of the third side and the center of the circular structure.

19. The electronic device according to claim 18, wherein the third angle ranges from 85 degrees to 95 degrees.

20. The electronic device according to claim 18, wherein when the electronic device is in a third state, the other end of the second side and the one end of the third side are in contact with the recess.

21. The electronic device according to claim 20, wherein when the electronic device is in a fourth state, the other end of the third side is in contact with the first part.

\* \* \* \* \*